(12) United States Patent
Kudo et al.

(10) Patent No.: US 11,901,836 B2
(45) Date of Patent: Feb. 13, 2024

(54) POWER CONTROL UNIT

(71) Applicant: Hitachi Astemo, Ltd., Hitachinaka (JP)

(72) Inventors: Daiki Kudo, Utsunomiya (JP); Shogo Tokita, Shioya-gun (JP); Kohei Nakano, Utsunomiya (JP)

(73) Assignee: HITACHI ASTEMO, LTD., Hitachinaka (JP)

(\*) Notice: Subject to any disclaimer, the term of this patent is extended or adjusted under 35 U.S.C. 154(b) by 181 days.

(21) Appl. No.: 17/405,466

(22) Filed: Aug. 18, 2021

(65) Prior Publication Data

US 2022/0077791 A1 Mar. 10, 2022

(30) Foreign Application Priority Data

Sep. 4, 2020 (JP) .................................. 2020-149203

(51) Int. Cl.
| | |
|---|---|
| *H05K 7/20* | (2006.01) |
| *H02G 5/10* | (2006.01) |
| *H02M 7/00* | (2006.01) |
| *H02M 7/537* | (2006.01) |
| *H02G 5/02* | (2006.01) |
| *H02M 3/158* | (2006.01) |

(52) U.S. Cl.
CPC .............. *H02M 7/003* (2013.01); *H02G 5/02* (2013.01); *H02G 5/10* (2013.01); *H02M 3/1582* (2013.01); *H02M 7/537* (2013.01); *H05K 7/209* (2013.01)

(58) Field of Classification Search
None
See application file for complete search history.

(56) References Cited

U.S. PATENT DOCUMENTS

| | | | | |
|---|---|---|---|---|
| 5,463,252 A | \* | 10/1995 | Jones | ..................... H01L 25/18 |
| | | | | 257/723 |
| 6,870,253 B1 | \* | 3/2005 | Ushijima | .............. H01L 25/115 |
| | | | | 257/691 |

(Continued)

FOREIGN PATENT DOCUMENTS

| | | |
|---|---|---|
| JP | 2013219919 A | 10/2013 |
| JP | 2014222962 A | 11/2014 |

(Continued)

OTHER PUBLICATIONS

JPO Notification of Reasons for Rejection for corresponding JP Application No. 2020-149203; dated Sep. 7, 2021.

*Primary Examiner* — Courtney L Smith
(74) *Attorney, Agent, or Firm* — Cantor Colburn LLP

(57) ABSTRACT

A power control unit includes a plurality of power devices, a heat dissipation member disposed to face the power device with an insulating resin member interposed therebetween, and a plurality of plate-shaped bus bars each of which has one end connected to the power device, in which at least one of the plurality of bus bars is erected so that a direction along a plate width is aligned with a direction along a normal line of a surface of the heat dissipation member facing the power device, the power devices are arranged in a row along one direction in a straight line, an input bus bar is disposed on one side of the power device in a direction orthogonal to an arrangement direction of the power device, and an output bus bar is disposed on the other side of the power device in the orthogonal direction.

7 Claims, 7 Drawing Sheets

(56) References Cited

U.S. PATENT DOCUMENTS

| | | | | |
|---|---|---|---|---|
| 8,253,236 B2* | 8/2012 | Oi | ............ | H01L 24/48 |
| | | | | 257/E23.142 |
| 9,474,189 B2* | 10/2016 | Kawauchi | .......... | H05K 7/20436 |
| 9,615,490 B2* | 4/2017 | Topolewski | ....... | H05K 7/20927 |
| 10,404,186 B2* | 9/2019 | Schutten | .............. | H05K 1/0218 |
| 10,660,229 B2* | 5/2020 | Umeda | .................. | B60L 50/51 |
| 2006/0064998 A1* | 3/2006 | Funahashi | ............... | F01C 21/10 |
| | | | | 62/228.4 |
| 2008/0049477 A1* | 2/2008 | Fujino | ................ | H02M 7/5387 |
| | | | | 323/272 |
| 2012/0250384 A1* | 10/2012 | Ito | .......................... | H02K 11/33 |
| | | | | 363/132 |
| 2020/0136522 A1* | 4/2020 | Nojima | ................ | H02M 7/797 |

FOREIGN PATENT DOCUMENTS

| | | | |
|---|---|---|---|
| JP | 5671417 B | 2/2015 | |
| JP | 2019220719 A | 12/2019 | |

* cited by examiner

POWER CONTROL UNIT

CROSS REFERENCE TO RELATED APPLICATIONS

The present invention claims priority under 35 U.S.C. § 119 to Japanese Application No. 2020-149203 filed Sep. 4, 2020, the entire content of which is incorporated herein by reference.

BACKGROUND OF THE INVENTION

Field of the Invention

The present disclosure relates to a power control unit.

Description of Related Art

A vehicle such as an electric vehicle is provided with a power control unit (PCU) between the battery and the motor. Such a power control unit includes a plurality of power devices (power semiconductor chips) and a power module case for accommodating these power devices.

For example, as disclosed in Japanese Patent Granted Publication No. 5671417, the power control unit is provided with a plate-shaped bus bar that serves as a transmission path. The bus bar is connected to the power device.

SUMMARY OF THE INVENTION

However, in Japanese Patent Granted Publication No. 5671417, a plate-shaped bus bar is disposed so that the front and back surfaces face in the vertical direction. Further, power devices are disposed on both sides of the bus bar that is interposed therebetween. Accordingly, it is necessary to secure a wide disposition space for the bus bar and the power device in plan view, and the shape of the power control unit in plan view becomes large.

The present disclosure has been made in view of the above-mentioned problems, and in a power control unit including a power device and a bus bar connected to the power device, an object is to reduce the size of the shape of the power control unit in plan view.

The present disclosure employs the following aspects as means for solving the above problems.

A power control unit according to a first aspect adopts a configuration, in which the power control unit includes a plurality of power devices, a heat dissipation member disposed to face the power device with an insulating resin member interposed therebetween, and a plurality of plate-shaped bus bars each of which has one end connected to the power device, in which at least one of the plurality of bus bars is erected so that a direction along a plate width is aligned with a direction along a normal line of a surface of the heat dissipation member facing the power device, the power devices are arranged in a row along one direction in a straight line, an input bus bar, which is a bus bar connected to an input terminal of the power device, is disposed on one side of the power device in a direction orthogonal to an arrangement direction of the power device, and an output bus bar, which is a bus bar connected to an output terminal of the power device, is disposed on the other side of the power device in the orthogonal direction.

In the first aspect, the power control unit according to a second aspect adopts a configuration in which the input bus bar is erected so that the direction along the plate width is aligned with the direction along the normal line of the surface of the heat dissipation member facing the power device.

In the second aspect, the power control unit according to a third aspect adopts a configuration in which the power control unit further includes a high-voltage side input bus bar connected to a positive electrode of the power device as the input bus bar, and a low-voltage side input bus bar connected to a negative electrode of the power device as the input bus bar, in which the high-voltage side input bus bar and the low-voltage side input bus bar are disposed to face each other with an insulating resin member interposed therebetween.

In the second or third aspect, the power control unit according to a fourth aspect adopts a configuration in which the other end of the input bus bar is disposed outside a lead pin to connect the power device to a circuit board in the orthogonal direction.

In one of the second to fourth aspects, the power control unit according to a fifth aspect adopts a configuration in which the insulating resin member has a wall portion disposed between the power device and the power device, and a common input bus bar which straddles the wall portion and is connected to two power devices is provided as the input bus bar.

In one of the first to fifth aspects, the power control unit according to a sixth aspect adopts a configuration in which the power device includes a first conductor substrate and a second conductor substrate connected to each other, the first conductor substrate has a connection pad connected to the second conductor substrate, and a portion of the first conductor substrate on which the connection pad is provided is projected toward the second conductor substrate.

In such present disclosure, at least one of the plurality of bus bars is erected so that the direction along the plate width is aligned with the direction along the normal line of the surface of the heat dissipation member facing the power device. Further, the power devices are arranged in a row along one direction in a straight line. Further, the input bus bar, which is a bus bar connected to an input terminal of the power device, is disposed on one side of the power device in a direction orthogonal to the arrangement direction of the power device. Further, the output bus bar, which is a bus bar connected to the output terminal of the power device, is disposed on the other side of the power device in the orthogonal direction. Accordingly, according to the present disclosure, it is not necessary to lay the bus bar flat in parallel with the facing surface of the heat dissipation member with respect to the power device and to arrange a plurality of power devices on both sides of the bus bar that is laid flat. Accordingly, the installation space of the bus bar in plan view can be reduced, and the shape of the power module and the power control unit in plan view can be reduced.

DETAILED DESCRIPTION OF THE INVENTION

Hereinafter, each embodiment of a power control unit according to the present disclosure will be described with reference to the drawings.

Figure 1:
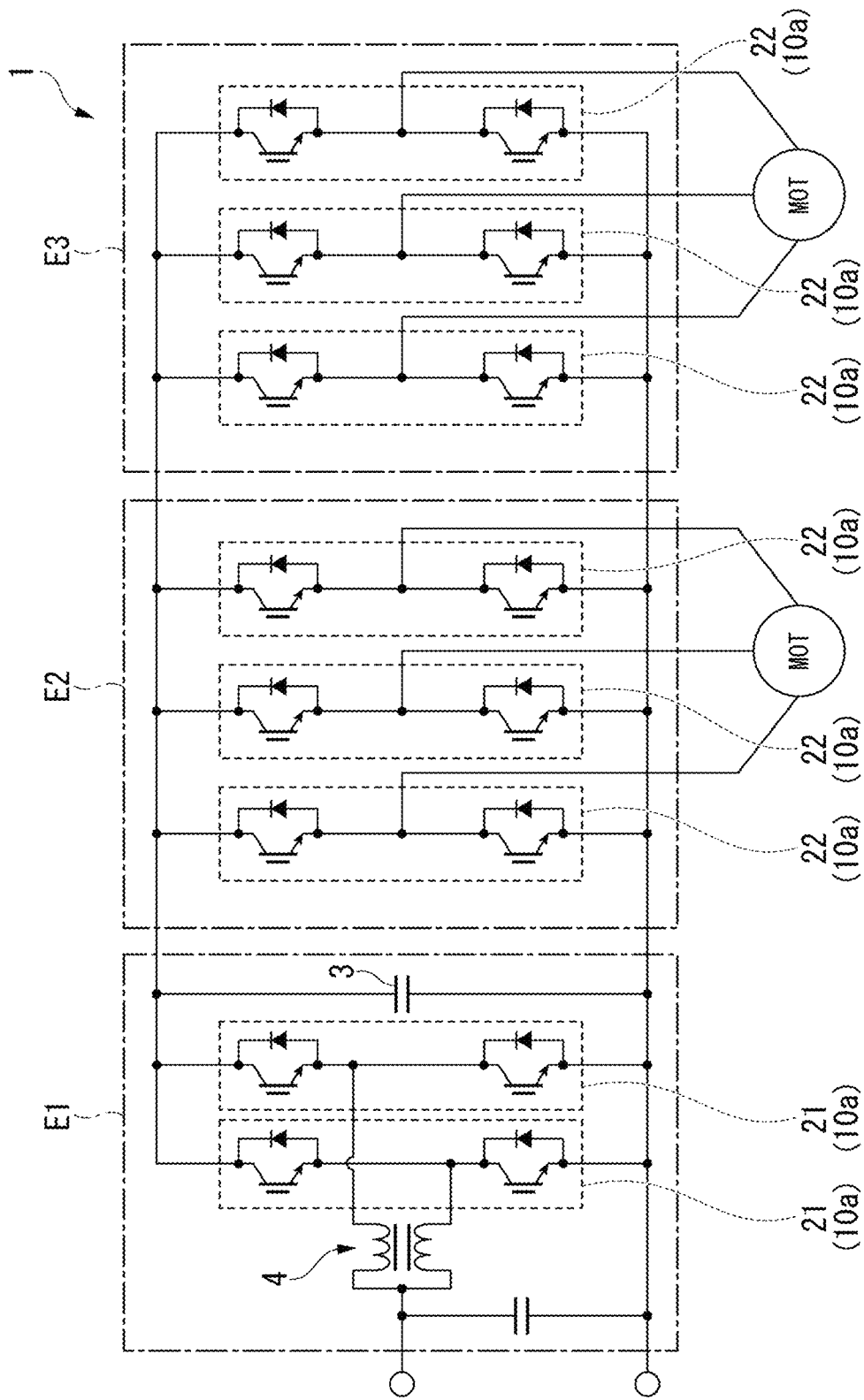
FIG. 1 is a circuit diagram showing a schematic electrical configuration of a power control unit according to an embodiment of the present disclosure.

FIG. 1 is a circuit diagram showing a schematic electrical configuration of a power control unit 1 of the present embodiment.

The power control unit 1 of the present embodiment is mounted on a vehicle such as an electric vehicle and is provided between a motor (load) (not shown) and a battery. Such power control unit 1 of the present embodiment includes an intelligent power module, a capacitor 3, a reactor 4, a DCDC converter, and a main body case.

The intelligent power module includes a power module 10 (see FIG. 2), a circuit board, or the like. The power module 10 includes a plurality of power devices 10a having a power semiconductor element (see FIG. 2), a power module case 10b holding these power devices 10a (see FIG. 2), a bus bar 10c connected to the power device 10a (see FIG. 3), an insulating resin member 10d (see FIG. 2) for preventing a short circuit of the bus bar 10c, and a water jacket 10e for cooling (heat dissipation member, see FIG. 3), or the like. The circuit board is stacked on the power module 10 and includes a drive circuit for driving the power device 10a or the like.

The capacitor 3 is connected to the intelligent power module and is disposed on the side of the power module 10. The reactor 4 is disposed below the intelligent power module. The DCDC converter is disposed on the side of the reactor 4 and below the intelligent power module. The DCDC converter converts the battery power into a voltage suitable for surrounding electronic devices (electronic devices mounted on a circuit board, or the like). This DCDC converter is omitted in FIG. 1.

The main body case is a case that accommodates the intelligent power module, the capacitor 3, the reactor 4, and the DCDC converter.

As shown in FIG. 1, the power control unit 1 includes a buck-boost circuit E1, a first inverter circuit E2, and a second inverter circuit E3. The buck-boost circuit E1, the first inverter circuit E2, and the second inverter circuit E3 are constituted with the power device 10a, the capacitor 3, the reactor 4, or the like. The power control unit 1 converts the power supplied from the battery into three-phase AC power and supplies the AC power to the motor. Further, the power control unit 1 forwards the regenerative power from the motor to the battery.

As shown in FIG. 1, the buck-boost circuit E1 includes two power devices 10a (a buck-boost circuit power device 21), the capacitor 3 (smoothing capacitor), and the reactor 4. A power transistor is provided in each power device 10a. These power transistors are mounted on a base member B (see FIG. 4), which is a conductor substrate, as a semiconductor chip C (see FIG. 4).

The first inverter circuit E2 includes the three power devices 10a (an inverter circuit power device 22). A power transistor is provided in each power device 10a. These power transistors are mounted on the base member B (see FIG. 4), which is a conductor substrate, as the semiconductor chip C (see FIG. 4).

The second inverter circuit E3 includes the three power devices 10a (the inverter circuit power device 22). A power transistor is provided in each power device 10a. These power transistors are mounted on the base member B (see FIG. 4), which is a conductor substrate, as the semiconductor chip C (see FIG. 4).

Figure 2:
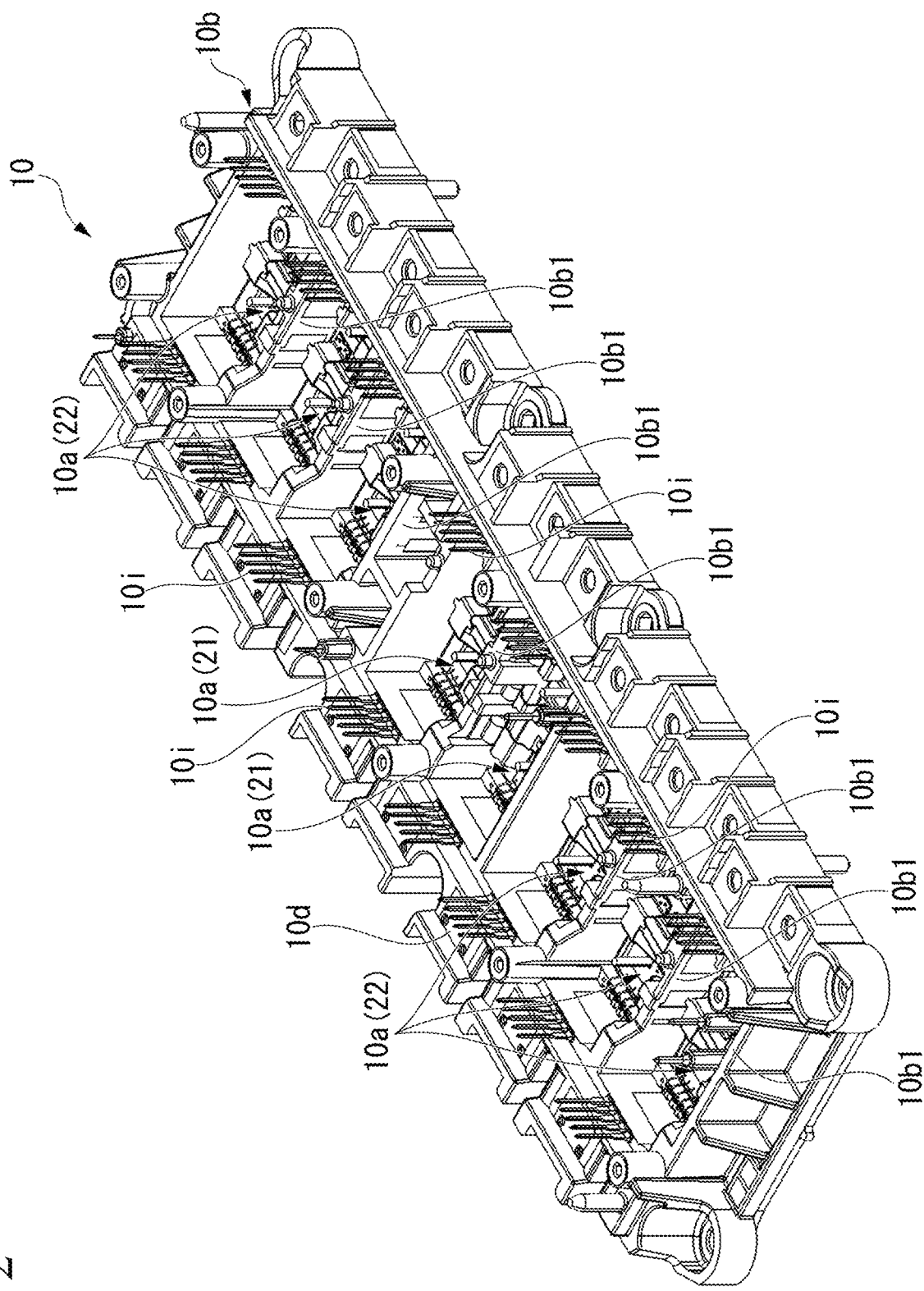
FIG. 2 is a perspective view of a power module included in the power control unit according to the embodiment of the present disclosure.
Figure 3:
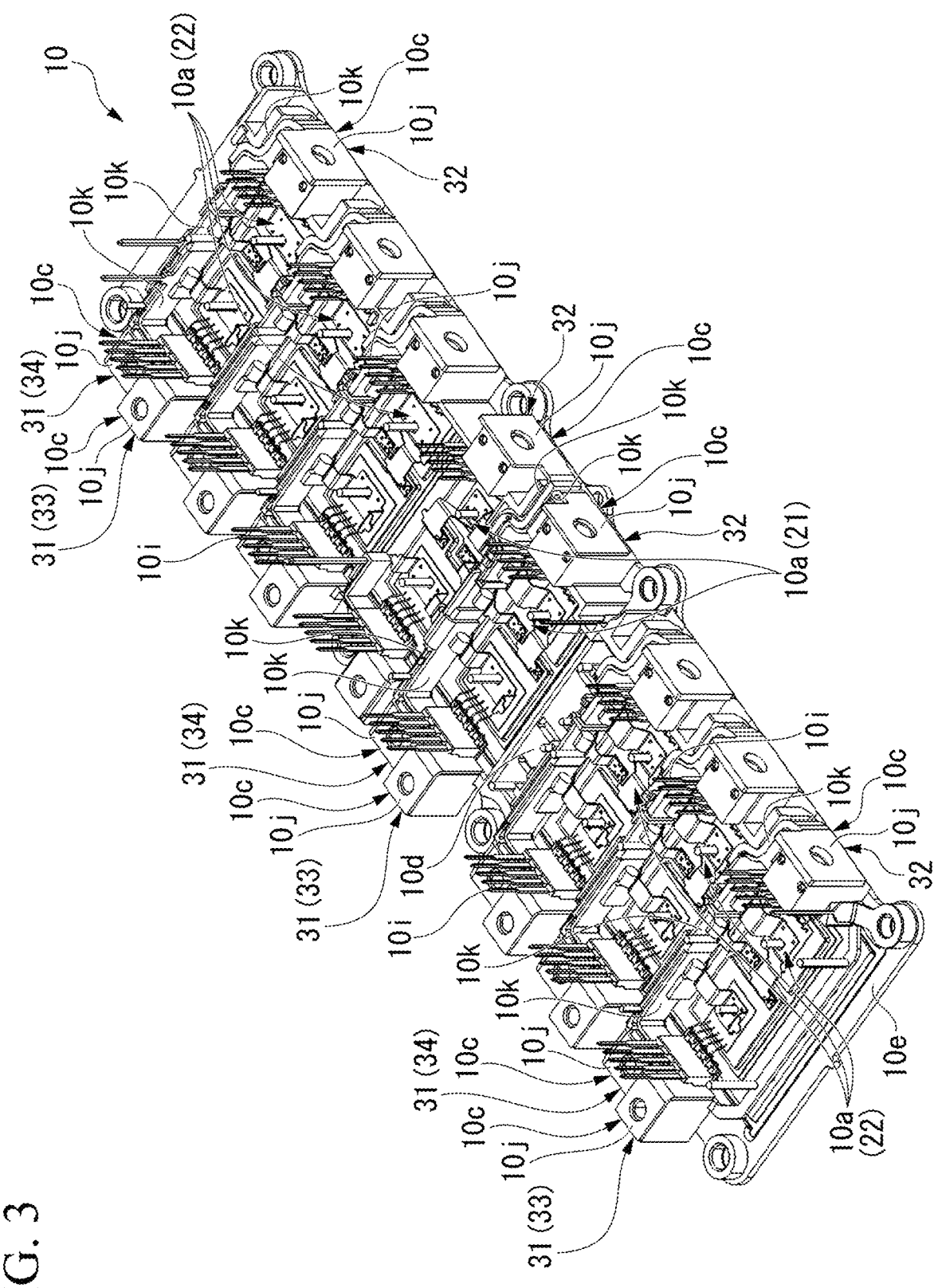
FIG. 3 is a perspective view of the power module included in the power control unit according to the embodiment of the present disclosure, omitting a power module case.

FIG. 2 is a perspective view of the power module 10 included in the power control unit 1 of the present embodiment. Further, FIG. 3 is a perspective view of the power module 10 in which the power module case 10b is omitted. FIG. 2 is a perspective view of the power module 10 as viewed from the input terminal side. Further, FIG. 3 is a perspective view of the power module 10 as viewed from the output terminal side.

As described above, the power module 10 includes the plurality of (eight in the present embodiment) power devices 10a, the power module case 10b, the bus bar 10c, the insulating resin member 10d, and the water jacket 10e for cooling. In FIG. 2, the water jacket 10e is omitted. Further, in FIG. 3, only the top plate portion of the water jacket 10e is shown.

The power device 10a is a chipped switching device including a switching element driven by a drive circuit provided on a circuit board. The power device 10a forms, for example, an arm of the first inverter circuit E2 and the second inverter circuit E3, and a portion of the buck-boost circuit E1.

Figure 4:
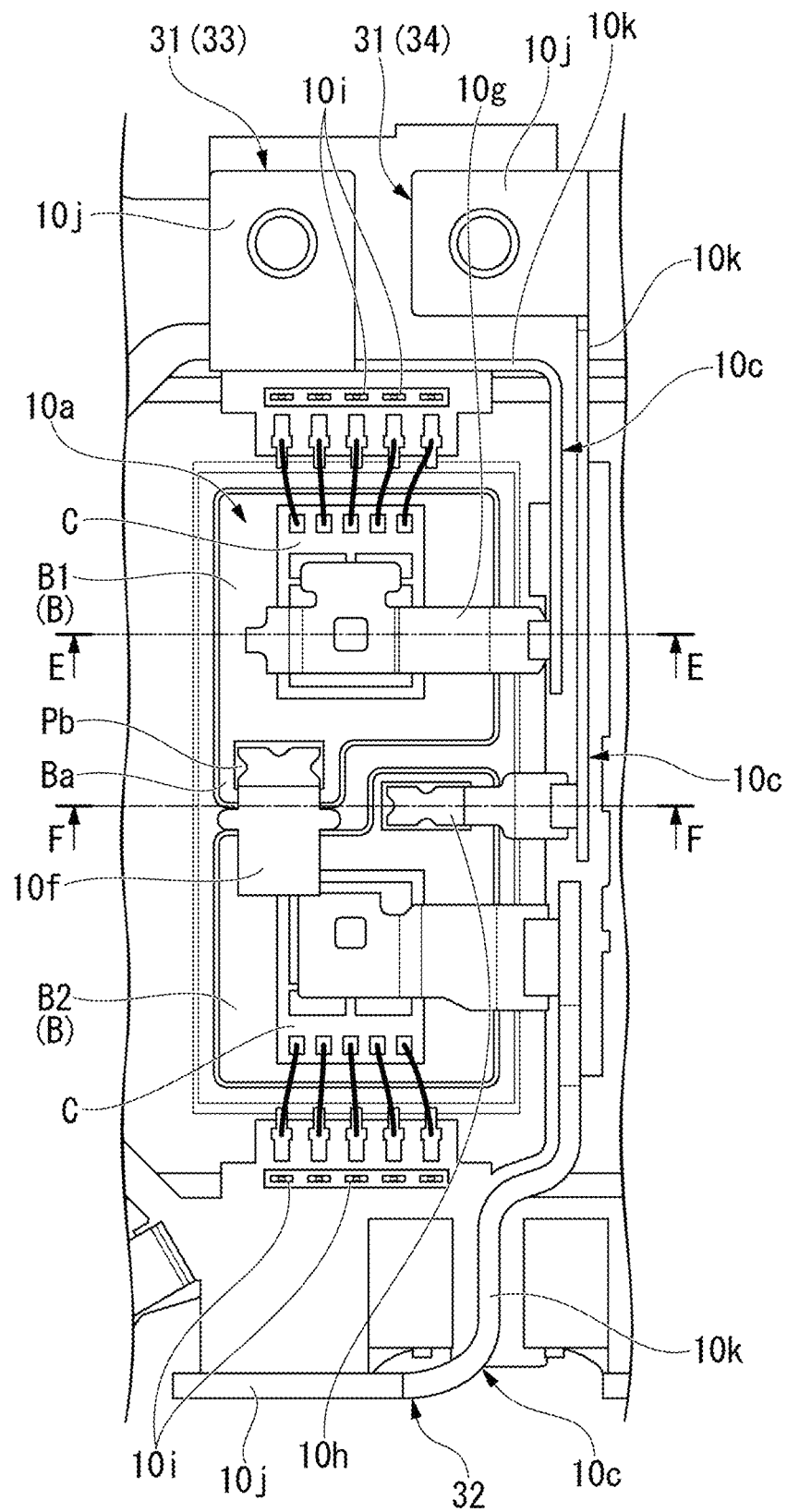
FIG. 4 is an enlarged plan view of one power device included in the power control unit according to the embodiment of the present disclosure.

FIG. 4 is an enlarged plan view of one power device 10a. Also in FIG. 4, the power module case 10b is omitted as in FIG. 3. As shown in this figure, the power device 10a includes two base members B (first conductor substrate B1 and second conductor substrate B2) and the semiconductor chip C mounted on each base member B. The base member B is a conductor substrate on which a wire and a connection pad are formed. The first conductor substrate B1 is provided with a connection pad Pb connected to the second conductor substrate B2 via the semiconductor chip C. In the first conductor substrate B1, the portion Ba on which the connection pad Pb is provided is projected toward the second conductor substrate B2.

The power module 10 includes a central lead frame 10f. The connection pad Pb of the first conductor substrate B1 and the semiconductor chip C mounted on the second conductor substrate B2 are connected by the central lead frame 10f. The central lead frame 10f is joined to the connection pad Pb and the semiconductor chip C by soldering.

Further, the power module 10 includes a low-voltage side lead frame 10g and a high-voltage side lead frame 10h. The semiconductor chip C mounted on the first conductor substrate B1 and the bus bar 10c are connected by the low-voltage side lead frame 10g. The low-voltage side lead frame 10g is joined to the semiconductor chip C and the bus bar 10c by soldering. Further, the semiconductor chip C mounted on the second conductor substrate B2 and the bus bar 10c are connected by the high-voltage side lead frame 10h. The high-voltage side lead frame 10h is joined to the semiconductor chip C and the bus bar 10c by soldering.

Each semiconductor chip C is connected to a lead pin 10*i* provided in the power module case 10*b* by a lead wire. The lead pin 10*i* is connected to the circuit board. The lead pin 10*i* is provided to extend in the vertical direction.

In the present embodiment, as shown in FIG. 2 and FIG. 3, such power devices 10*a* are linearly arranged in a straight line along one direction. In the present embodiment, the inverter circuit power devices 22 are arranged so that the buck-boost circuit power device 21 is interposed therebetween. That is, the three inverter circuit power devices 22 are disposed at each end of the power device 10*a* in the arrangement direction, and the two buck-boost circuit power devices 21 are disposed adjacent to each other in the center.

The power module case 10*b* is made of an insulating resin material. Further, the power module case 10*b* is formed in a substantially rectangular shape with the arrangement direction of the power device 10*a* as the longitudinal direction. The power module case 10*b* has an accommodating recess for accommodating the power device 10*a*. Such power module case 10*b* holds the plurality of power devices 10*a* and has a partition wall 10*b*1 that embeds a bus bar main body portion 10*k* of an input bus bar 31 as described above.

The bus bar 10*c* is a plate-shaped conductive portion that connects the battery or motor and the power device 10*a*. The bus bar 10*c* has an external connection terminal portion 10*j* and the bus bar main body portion 10*k*. A plurality of bus bars 10*c* are provided for each power device 10*a*, and one end thereof is connected to the power device 10*a*. The external connection terminal portion 10*j* is a portion used as a terminal portion for connecting the power module 10 to the outside. The bus bar main body portion 10*k* is provided to be routed from the external connection terminal portion 10*j* to the lead frame (the central lead frame 10*f*, the low-voltage side lead frame 10*g*, and the high-voltage side lead frame 10*h*) connected to the power device 10*a*.

In the present embodiment, the power module 10 includes the input bus bar 31 and an output bus bar 32 as the bus bar 10*c*. The input bus bar 31 is the bus bar 10*c* that connects the capacitor 3 and the input terminal of the power device 10*a*. Further, the input bus bar 31 is connected to the battery via the output end of the buck-boost circuit E1. The input bus bar 31 (the input bus bar 31 connected to the negative electrode of the power device 10*a*) connected to the low voltage terminal of the buck-boost circuit E1 (battery) is referred to as a low-voltage side input bus bar 33, and the input bus bar 31 (the input bus bar 31 connected to the positive electrode of the power device 10*a*) connected to the high voltage terminal of the buck-boost circuit E1 (battery) is referred to as a high-voltage side input bus bar 34.

Figure 5A:
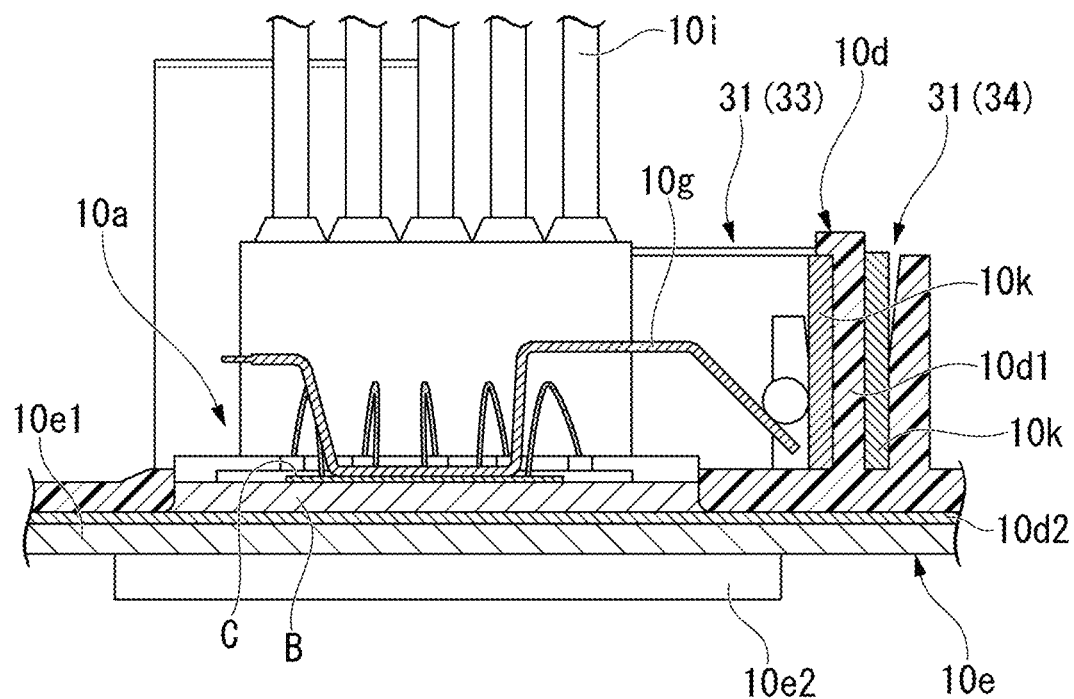
FIG. 5A is a cross-sectional view taken along the line E-E of FIG. 4.
Figure 5B:
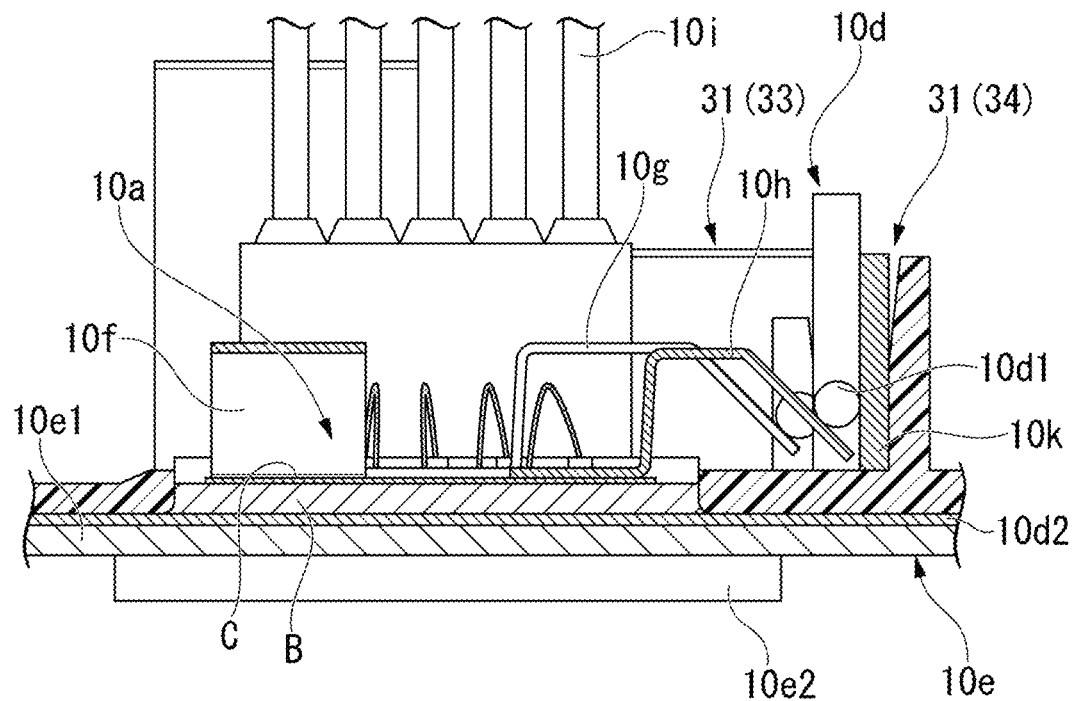
FIG. 5B is a cross-sectional view taken along the line F-F of FIG. 4.

FIG. 5A is a cross-sectional view taken along the line E-E of FIG. 4. Further, FIG. 5B is a cross-sectional view taken along the line F-F of FIG. 4. In FIG. 5A and FIG. 5B, the power module case 10*b* omitted in FIG. 4 is shown. As shown in FIG. 4, FIG. 5A and FIG. 5B, the input bus bar 31 is provided so that the plate width direction (the width direction orthogonal to the current flowing direction and the plate thickness direction) of the bus bar main body portion 10*k* is aligned with the vertical direction. In the present embodiment, the top surface of the water jacket 10*e* (a top surface 10*e*1 of the top plate portion) is the facing surface with respect to the power device 10*a*. The facing surface is a horizontal plane. Accordingly, the input bus bar 31 is erected so that the direction along the plate width is aligned with the direction along the normal line of the surface of the water jacket 10*e* facing the power device 10*a*. In such input bus bar 31, the bus bar main body portion 10*k* is erected with respect to the water jacket 10*e* as described above. Accordingly, the installation space of the input bus bar 31 in plan view is extremely smaller than that in a case where the bus bar main body portion 10*k* is placed flat in parallel with the facing surface of the water jacket 10*e*.

In the present embodiment, the bus bar main body portion 10*k* of the input bus bar 31 is erected at each spacing between the power device 10*a* and the power device 10*a* having a rectangular shape in plan view as described above. Accordingly, it is not necessary to adopt a configuration in which the input bus bar 31 is placed flat in parallel with the facing surface of the water jacket 10*e* with respect to the power device 10*a*, and the plurality of power devices 10*a* are arranged on both sides of the input bus bar 31 that are placed flat. Accordingly, the installation space of the input bus bar 31 in plan view can be reduced, and the shape of the power module 10 and further the power control unit 1 in plan view can be reduced.

As shown in FIG. 5A, the bus bar main body portion 10*k* of the low-voltage side input bus bar 33 and the bus bar main body portion 10*k* of the high-voltage side input bus bar 34 are disposed in parallel with a vertical wall 10*d*1 of the insulating resin member 10*d* interposed therebetween. The bus bar main body portion 10*k* of the low-voltage side input bus bar 33 connected to the one inverter circuit power device 22 and the bus bar main body portion 10*k* of the high-voltage side input bus bar 34 form a pair and are disposed in parallel with each other such that the vertical wall 10*d*1 of the insulating resin member 10*d* is interposed therebetween.

Further, the heat capacity of the input bus bar 31 is preferably large to suppress the heat generated by the power device 10*a* from being transferred to the capacitor 3. Accordingly, it is preferable that the lower end of the bus bar main body portion 10*k* of the input bus bar 31 is as close as possible to the facing surface of the water jacket 10*e*. Further, it is preferable that the upper end of the bus bar main body portion 10*k* of the input bus bar 31 is kept away from the water jacket 10*e* as much as possible. Accordingly, as shown in FIG. 5A, the lower end of the bus bar main body portion 10*k* of the input bus bar 31, for example, is disposed closer to the water jacket 10*e* than the height of the top surface of the power device 10*a*. Further, as shown in FIG. 5A, the upper end of the bus bar main body portion 10*k* of the input bus bar 31, for example, is disposed higher than the upper end position of the lead frame (the central lead frame 10*f*, the low-voltage side lead frame 10*g*, and the high-voltage side lead frame 10*h*).

The bus bar main body portion 10*k* of the input bus bar 31 is disposed with respect to the water jacket 10*e* with only a bottom portion 10*d*2 of the insulating resin member 10*d* interposed therebetween. Accordingly, in the present embodiment, the heat of the input bus bar 31 easily escapes with respect to the water jacket 10*e*. Accordingly, the heat transferred from the power device 10*a* to the input bus bar 31 is absorbed by the water jacket 10*e* and can be prevented from being dissipated to the outside.

Figure 6:
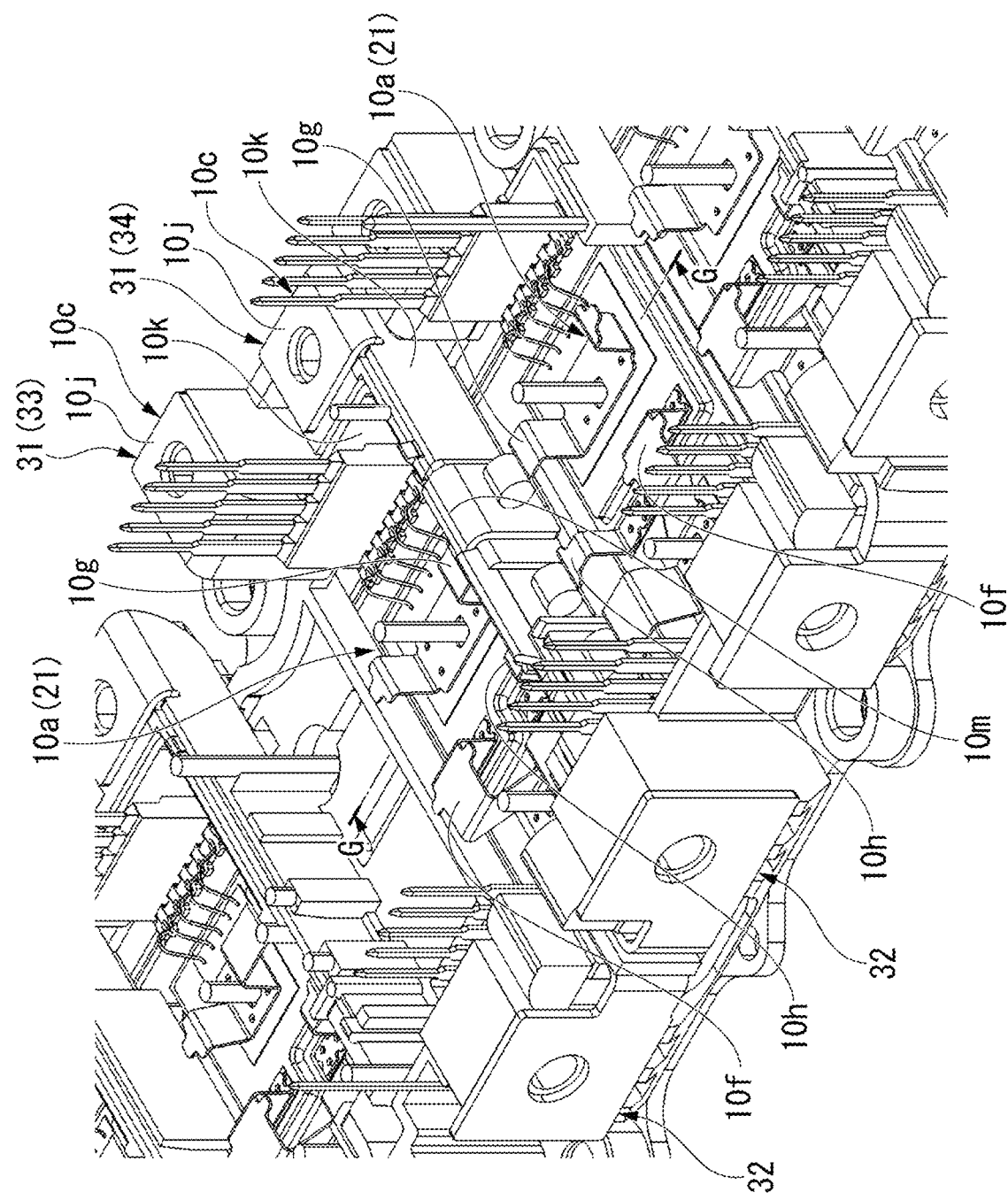
FIG. 6 is an enlarged perspective view including a main portion of two buck-boost circuit power devices included in the power control unit according to the embodiment of the present disclosure.
Figure 7:
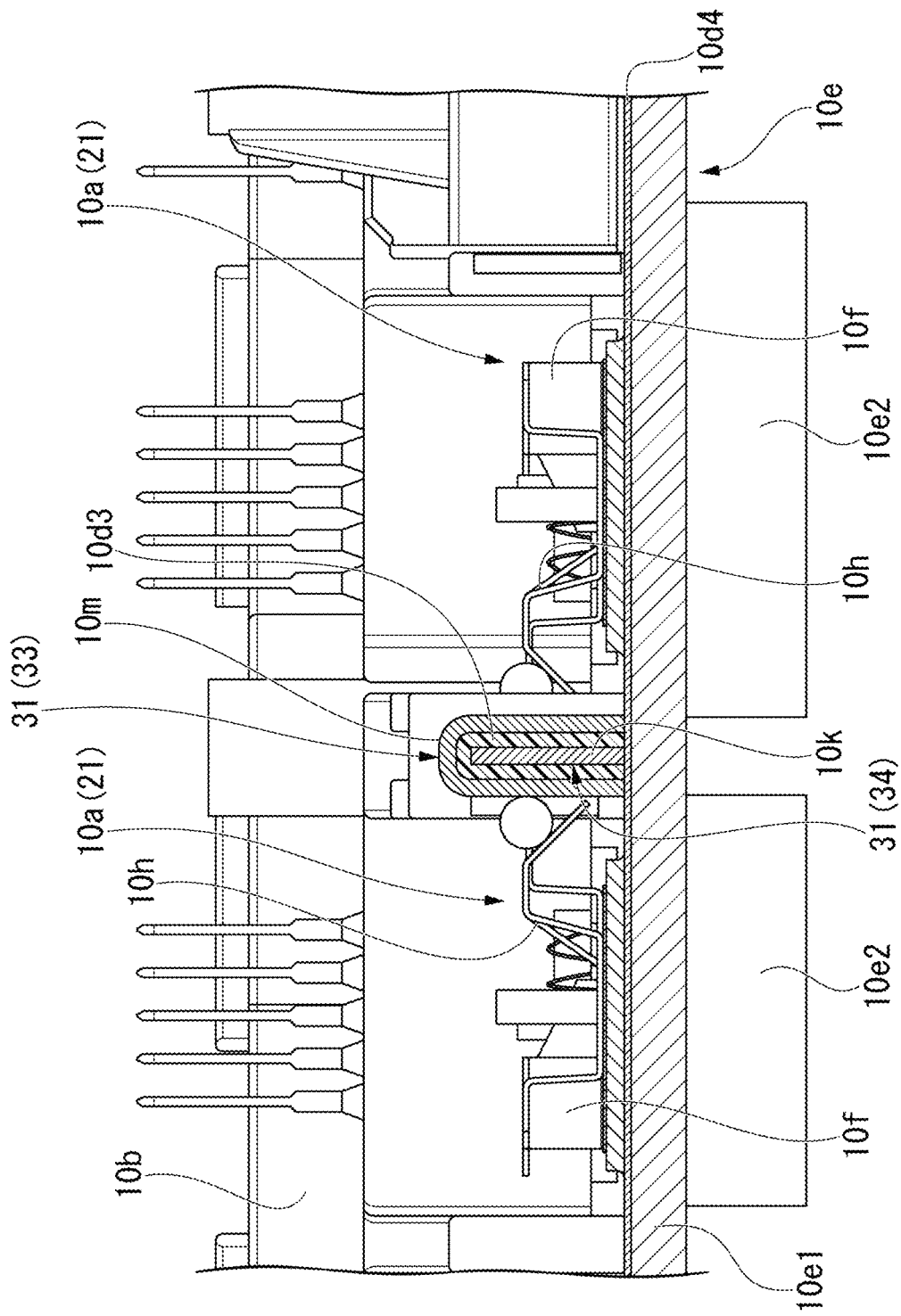
FIG. 7 is a cross-sectional view taken along the line G-G of FIG. 6.

FIG. 6 is an enlarged perspective view including a main portion of two buck-boost circuit power devices 21. Also in FIG. 6, the power module case 10*b* is omitted. Further, FIG. 7 is a cross-sectional view taken along the line G-G of FIG. 6. FIG. 7 shows the power module case 10*b*. As shown in these figures, the low-voltage side input bus bar 33 is shared by these two buck-boost circuit power devices 21. Further, in these two buck-boost circuit power devices 21, the high-voltage side input bus bar 34 is also shared. That is, in the present embodiment, the power module 10 includes a common input bus bar that is connected to the two power devices 10*a* straddling a covering wall portion 10*d*3.

As shown in FIG. 7, the covering wall portion 10*d*3 (wall portion) of the insulating resin member 10*d* is provided to cover the high-voltage side input bus bar 34 connected to one of the buck-boost circuit power devices 21. Further, a branch portion 10*m* is provided in the bus bar main body portion 10*k* of the low-voltage side input bus bar 33 to straddle the covering wall portion 10*d*3. One end of the branch portion 10*m* is soldered to the low-voltage side lead frame 10*g* of one of the buck-boost circuit power devices 21. Further, the other end of the branch portion 10*m* is soldered to the low-voltage side lead frame 10*g* of the other of the buck-boost circuit power devices 21.

The output bus bar 32 is a bus bar 10*c* that connects the motor and the power device 10*a*. The output bus bar 32 is provided so that the plate width direction (the width direction orthogonal to the current flowing direction and the plate thickness direction) of the bus bar main body portion 10*k* is aligned with the vertical direction. In the present embodiment, the output bus bar 32 is erected so that the direction along the plate width is aligned with the direction along the normal line of the surface of the water jacket 10*e* facing the power device 10*a*. In such output bus bar 32, the bus bar main body portion 10*k* is erected with respect to the water jacket 10*e* as described above. Accordingly, the installation space of the output bus bar 32 in plan view is extremely smaller than that in a case where the bus bar main body portion 10*k* is placed flat in parallel with the facing surface of the water jacket 10*e*.

In this manner, in the present embodiment, the bus bar main body portion 10*k* of the output bus bar 32 is erected and disposed between the power devices 10*a* having a rectangular shape in plan view as described above. Accordingly, the installation space of the input bus bar 31 in plan view can be reduced, and the shape of the power module 10 and further the power control unit 1 in plan view can be reduced.

The heat capacity of the output bus bar 32 is preferably large in order to suppress the heat generated by the power device 10*a* from being transferred to the outside. Accordingly, it is preferable that the lower end of the bus bar main body portion 10*k* of the output bus bar 32 is as close as possible to the facing surface of the water jacket 10*e*. Further, it is preferable that the upper end of the bus bar main body portion 10*k* of the output bus bar 32 is kept away from the water jacket 10*e* as much as possible. Accordingly, the lower end of the bus bar main body portion 10*k* of the output bus bar 32, for example, is disposed closer to the water jacket 10*e* than the height of the top surface of the power device 10*a*. Further, the upper end of the bus bar main body portion 10*k* of the output bus bar 32, for example, is disposed higher than the upper end position of the lead frame (the central lead frame 10*f*, the low-voltage side lead frame 10*g*, and the high-voltage side lead frame 10*h*).

Further, the bus bar main body portion 10*k* of the output bus bar 32 is disposed with respect to the water jacket 10*e* with only a bottom portion 10*d*2 of the insulating resin member 10*d* interposed therebetween. Accordingly, in the present embodiment, the heat of the output bus bar 32 easily escapes with respect to the water jacket 10*e*. Accordingly, the heat transferred from the power device 10*a* to the output bus bar 32 is absorbed by the water jacket 10*e* and can be prevented from being dissipated to the outside.

As shown in FIG. 5A, FIG. 5B and FIG. 7, the bus bar main body portion 10*k* of the input bus bar 31, and the bus bar main body portion 10*k* of the output bus bar 32 are all included in the power module case 10*b*. The power module case 10*b* has the partition wall 10*b*1. Further, the partition wall 10*b*1 is disposed between the power device 10*a* and the power device 10*a*. For example, the bus bar main body portion 10*k* of the input bus bar 31, and the bus bar main body portion 10*k* of the output bus bar 32 are embedded in the partition wall 10*b*1.

Further, the external connection terminal portion 10*j* of the input bus bar 31 is a terminal portion connected to the capacitor 3. As shown in FIG. 2 and FIG. 3, the external connection terminal portion 10*j* is provided so that the connection surface thereof faces upward. As described above, in the present embodiment, the external connection terminal portion 10*j*, which is the other end of the input bus bar 31, is disposed on one side of the power device 10*a* in the direction orthogonal to the arrangement direction of the power device 10*a*. Further, in the present embodiment, all the external connection terminal portions 10*j* of the input bus bar 31 are disposed on one side of the power module 10 with the power device 10*a* interposed therebetween. Accordingly, the capacitor 3 is disposed on the side of the power module 10, and the capacitor 3 and the external connection terminal portion 10*j* of the input bus bar 31 can be easily connected.

Further, in the present embodiment, the external connection terminal portion 10*j* of the input bus bar 31 is disposed outside the lead pin 10*i* in the direction orthogonal to the arrangement direction of the power device 10*a*. Accordingly, it is possible to prevent the external connection terminal portion 10*j* of the input bus bar 31 from being covered with the circuit board, and to easily connect the capacitor 3 and the external connection terminal portion 10*j* of the input bus bar 31.

As shown in FIG. 3 or the like, the external connection terminal portions 10*j* of all the low-voltage side input bus bars 33 are disposed at the same height. Further, the external connection terminal portions 10*j* of all the high-voltage side input bus bars 34 are disposed at the same height. Further, the external connection terminal portion 10*j* of the low-voltage side input bus bar 33 is disposed above the external connection terminal portion 10*j* of the high-voltage side input bus bar 34. Accordingly, it is possible to easily distinguish between the external connection terminal portion 10*j* of the low-voltage side input bus bar 33 and the external connection terminal portion 10*j* of the high-voltage side input bus bar 34 based on the position in the height direction.

Further, the external connection terminal portion 10*j* of the output bus bar 32 is a terminal portion connected to the motor. As shown in FIG. 3, the external connection terminal portion 10*j* is provided so that the connection surface faces sideways. As described above, in the present embodiment, the external connection terminal portion 10*j*, which is the other end of the output bus bar 32, is disposed on the other side of the power device 10*a* in the direction orthogonal to the arrangement direction of the power device 10*a*. Further, in the present embodiment, all the external connection terminal portions 10*j* of the output bus bar 32 are disposed on one side of the power module 10 having the power device 10*a* interposed therebetween (one side opposite to the external connection terminal portion 10*j* of the input bus bar 31). Accordingly, the motor and the external connection terminal portion 10*j* of the output bus bar 32 can be easily connected.

Further, in the present embodiment, the external connection terminal portion 10*j* of the output bus bar 32 is disposed outside the lead pin 10*i* in the direction orthogonal to the arrangement direction of the power device 10*a*. Accordingly, it is possible to prevent the external connection terminal portion 10*j* of the output bus bar 32 from being covered with the circuit board, and to easily connect the motor and the external connection terminal portion 10j of the output bus bar 32.

The insulating resin member 10d is an insulating material for preventing the conductors from being short-circuited with each other. The insulating resin member 10d includes the vertical wall 10d1, the bottom portion 10d2, the covering wall portion 10d3, a sheet-shaped portion 10d4 (see FIG. 7), or the like. The vertical wall 10d1 is disposed between the power devices 10a. The bottom portion 10d2 is disposed between the bus bar main body portion 10k of the bus bar 10c and the water jacket 10e. The covering wall portion 10d3 is provided between the buck-boost circuit power devices 21. The sheet-shaped portion 10d4 is inserted between the power device 10a and the water jacket 10e.

The water jacket 10e is disposed below the power device 10a and absorbs the heat generated by the power device 10a. The water jacket 10e includes a top plate portion. The top surface 10e1 of the top plate portion is a facing surface with respect to the power device 10a. Further, a plurality of fins 10e2 are provided on the back surface of the top plate portion. Such water jacket 10e is disposed to face the power device 10a with the sheet-shaped portion 10d4 of the insulating resin member 10d interposed therebetween.

In the present embodiment, when the power device 10a is driven and thus the power device 10a generates heat, the heat is transferred from the power device 10a to the bus bar 10c. The heat transmitted to the bus bar 10c is transmitted to the water jacket 10e. As a result, the heat of the power device 10a is suppressed from being transferred to the outside other than the water jacket 10e.

The power control unit 1 of the present embodiment as described above has the plurality of power devices 10a, the water jacket 10e disposed to face the power device 10a with the insulating resin member 10d interposed therebetween, and the plurality of plate-shaped bus bars 10c each of which has one end connected to the power device 10a. Further, in the power control unit 1, at least one of the plurality of bus bars 10c is erected so that the direction along the plate width is aligned with the direction along the normal line of the surface of the water jacket 10e facing the power device 10a. Further, the power devices 10a are arranged in a row along one direction in a straight line. Further, the input bus bar 31, which is the bus bar 10c connected to an input terminal of the power device 10a, is disposed on one side of the power device 10a in a direction orthogonal to the arrangement direction of the power device 10a. Further, the output bus bar 32, which is the bus bar 10c connected to the output terminal of the power device 10a, is disposed on the other side of the power device 10a in the orthogonal direction.

As described above, in the power control unit 1 of the present embodiment, the power devices 10a are arranged in a row along one direction in a straight line. Further, the input bus bar 31 is disposed on one side of the power device 10a in a direction orthogonal to the arrangement direction of the power device 10a. Further, the output bus bar 32 is disposed on the other side of the power device 10a in the orthogonal direction. Accordingly, in the power control unit 1 of the present embodiment, it is not necessary to place the bus bar 10c flat in parallel with the facing surface of the water jacket 10e with respect to the power device 10a, and to arrange the plurality of power devices 10a on both sides of the input bus bar 31 that are placed flat. Accordingly, the installation space of the input bus bar 31 in plan view can be reduced, and the shape of the power module 10 and further the power control unit 1 in plan view can be reduced.

Further, the power control unit 1 of the present embodiment includes a plurality of input bus bars 31 connected to the input terminal of the power device 10a as the bus bar 10c. Further, the power control unit 1 includes the output bus bar 32 connected to the output terminal of the power device 10a as the bus bar 10c. The input bus bar 31 and the output bus bar 32 are erected so that the direction along the plate width is aligned with the direction along the normal line of the surface of the water jacket 10e facing the power device 10a. Accordingly, in the power control unit 1 of the present embodiment, it is possible to reduce the installation space of the input bus bar 31 and the output bus bar 32 in plan view.

Further, the power control unit 1 of the present embodiment includes, as the input bus bar 31, the high-voltage side input bus bar 34 connected to the positive electrode of the power device 10a, and the low-voltage side input bus bar 33 connected to the negative electrode of the power device 10a. Further, the high-voltage side input bus bar 34 and the low-voltage side input bus bar 33 are disposed to face each other with the vertical wall 10d1 of the insulating resin member 10d interposed therebetween. Accordingly, the high-voltage side input bus bar 34 and the low-voltage side input bus bar 33 can be collectively installed in a small space, and the installation space of the input bus bar 31 in plan view can be further reduced.

Further, in the power control unit 1 of the present embodiment, the end portion of the input bus bar 31 is disposed outside the lead pin 10i for connecting the power device 10a to the circuit board in the orthogonal direction. Accordingly, the capacitor 3 is disposed on the side of the power module 10, and the capacitor 3 and the external connection terminal portion 10j of the input bus bar 31 can be easily connected.

Further, the power control unit 1 of the present embodiment has the covering wall portion 10d3 in which the insulating resin member 10d is disposed between the power device 10a and the power device 10a. Further, the power control unit 1 includes, as the input bus bar 31, a common input bus bar (the low-voltage side input bus bar 33 and the high-voltage side input bus bar 34) that is connected to the two power devices 10a straddling the covering wall portion 10d3. Accordingly, one bus bar 10c can be connected to two power devices 10a, the number of bus bars 10c installed can be reduced, and the power control unit 1 can be further miniaturized.

Further, in the power control unit 1 of the present embodiment, the power device 10a includes the first conductor substrate B1 and the second conductor substrate B2 connected to each other. Further, the first conductor substrate B1 has the connection pad Pb connected to the second conductor substrate B2. Further, the portion Ba of the first conductor substrate B1 on which the connection pad Pb is provided is projected toward the second conductor substrate B2. By projecting the portion Ba on which the connection pad Pb is provided, it is not necessary to provide the first conductor substrate B1 around the portion Ba. Accordingly, the space can be effectively used, and the power device 10a can be miniaturized.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1 Power control unit
3 Capacitor (electrical component)

4 Reactor
10 Power module
10a Power device
10b Power module case
10b1 Partition wall
10c Bus bar
10d Insulating resin member
10d1 Vertical wall
10d2 Bottom portion
10d3 Covering wall portion
10d4 Sheet-shaped portion
10e Water jacket (heat dissipation member)
10e1 Top surface
10e2 Fin
10i Lead pin
10j External connection terminal portion
10k Bus bar main body portion
10m Branch portion
11 Circuit board
21 Buck-boost circuit power device
22 Inverter circuit power device
31 Input bus bar
32 Output bus bar
33 Low-voltage side input bus bar (common input bus bar)
34 High-voltage side input bus bar (common input bus bar)
B Base member
B1 First conductor substrate
B2 Second conductor substrate
Ba Portion
C Semiconductor chip
Pb Connection pad

What is claimed is:

1. A power control unit comprising:
a plurality of power devices;
a heat dissipation member disposed to face the plurality of power devices with an insulating resin member interposed therebetween; and
a plurality of plate-shaped bus bars each of which has one end connected to a respective one of the plurality of power devices, wherein
at least one of the plurality of bus bars is erected so that a direction along a plate width is aligned with a direction along a normal line of a surface of the heat dissipation member facing the plurality of power devices,
the plurality of power devices are arranged in a row along one direction in a straight line,
a plurality of input bus bars, each connected to a respective input terminal of the plurality of power devices, are disposed on one side of the plurality of power devices in a direction orthogonal to an arrangement direction of the plurality of power devices,
a plurality of output bus bars, each connected to a respective output terminal of the plurality of power devices, are disposed on the other side of the power device in the orthogonal direction, and
each of the plurality of plate-shaped bus bars is disposed on one side of the respective one of the plurality of power devices in the arrangement direction of the plurality of power devices.

2. The power control unit of claim 1, wherein the plurality of input bus bars are erected so that the direction along the plate width is aligned with the direction along the normal line of the surface of the heat dissipation member facing the plurality of power devices.

3. The power control unit of claim 2, further comprising:
a high-voltage side input bus bar connected to a positive electrode of the plurality of power devices as the plurality of input bus bars; and
a low-voltage side input bus bar connected to a negative electrode of the plurality of power devices as the plurality of input bus bars, wherein
the high-voltage side input bus bar and the low-voltage side input bus bar are disposed to face each other with an insulating resin member interposed therebetween.

4. The power control unit of claim 2, wherein the other end of the plurality of input bus bars is disposed outside a lead pin to connect the plurality of power devices to a circuit board in the orthogonal direction.

5. A power control unit comprising:
a plurality of power devices;
a heat dissipation member disposed to face the plurality of power devices with an insulating resin member interposed therebetween; and
a plurality of plate-shaped bus bars each of which has one end connected to a respective one of the plurality of power devices, wherein
at least one of the plurality of bus bars is erected so that a direction along a plate width is aligned with a direction along a normal line of a surface of the heat dissipation member facing the plurality of power devices,
the plurality of power devices are arranged in a row along one direction in a straight line,
a plurality of input bus bars, each connected to a respective input terminal of the plurality of power devices, are disposed on one side of the plurality of power devices in a direction orthogonal to an arrangement direction of the plurality of power devices,
a plurality of output bus bars, each connected to a respective output terminal of the plurality of power devices, are disposed on the other side of the power device in the orthogonal direction, and
each of the plurality of plate-shaped bus bars is disposed on one side of the respective one of the plurality of power devices in the arrangement direction of the plurality of power devices,
the plurality of input bus bars are erected so that the direction along the plate width is aligned with the direction along the normal line of the surface of the heat dissipation member facing the plurality of power devices, wherein
the insulating resin member has a wall portion disposed between a first power device of the plurality of power devices and a second power device of the plurality of power devices adjacent to the first power device, and
a common input bus bar, which straddles the wall portion and is connected to the first power device and the second power device, provided as the plurality of input bus bars.

6. A power control unit comprising:
a plurality of power devices;
a heat dissipation member disposed to face the plurality of power devices with an insulating resin member interposed therebetween; and
a plurality of plate-shaped bus bars each of which has one end connected to a respective one of the plurality of power devices, wherein
at least one of the plurality of bus bars is erected so that a direction along a plate width is aligned with a direction along a normal line of a surface of the heat dissipation member facing the plurality of power devices, the plurality of power devices are arranged in a row along one direction in a straight line, a plurality of input bus bars, each connected to a respective input terminal of the plurality of power devices, are disposed on one side of the plurality of power devices in a direction orthogonal to an arrangement direction of the plurality of power devices, a plurality of output bus bars, each connected to a respective output terminal of the plurality of power devices, are disposed on the other side of the power device in the orthogonal direction, and each of the plurality of plate-shaped bus bars is disposed on one side of the respective one of the plurality of power devices in the arrangement direction of the plurality of power devices, wherein each of the plurality of power devices includes a first conductor substrate and a second conductor substrate connected to each other, the first conductor substrate has a connection pad connected to the second conductor substrate, and a portion of the first conductor substrate on which the connection pad is provided is projected toward the second conductor substrate.

7. The power control unit of claim 1, wherein an external connection terminal, provided on a second end opposite to a side of the plurality of input bus bars connected to the plurality of power devices, is disposed on a first side of the plurality of the power devices, and an external connection terminal, provided on a second end opposite to a side of the plurality of output bus bars connected to the plurality of power devices, is disposed on a second side of the plurality of the power devices.

* * * * *